United States Patent
Hao et al.

(10) Patent No.: US 7,939,863 B2
(45) Date of Patent: May 10, 2011

(54) AREA EFFICIENT 3D INTEGRATION OF LOW NOISE JFET AND MOS IN LINEAR BIPOLAR CMOS PROCESS

(75) Inventors: Pinghai Hao, Plano, TX (US); Marie Denison, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 138 days.

(21) Appl. No.: 12/537,352

(22) Filed: Aug. 7, 2009

(65) Prior Publication Data
US 2010/0032728 A1    Feb. 11, 2010

Related U.S. Application Data

(60) Provisional application No. 61/086,958, filed on Aug. 7, 2008.

(51) Int. Cl.
*H01L 27/12* (2006.01)
*H01L 29/78* (2006.01)
*H01L 21/762* (2006.01)

(52) U.S. Cl. ............ 257/262; 257/350; 257/E27.112; 257/E29.262; 257/E21.561; 257/E21.614; 438/155; 438/156; 438/186

(58) Field of Classification Search .......... 257/262, 257/265, 350, E27.112, E29.262, E21.561, 257/E21.614; 438/155, 156, 186
See application file for complete search history.

(56) References Cited

U.S. PATENT DOCUMENTS

| | | | | |
|---|---|---|---|---|
| 6,153,453 A | * | 11/2000 | Jimenez | 438/200 |
| 6,784,470 B2 | * | 8/2004 | Davis | 257/256 |
| 7,642,617 B2 | * | 1/2010 | Chen et al. | 257/504 |

* cited by examiner

*Primary Examiner* — Evan Pert
(74) *Attorney, Agent, or Firm* — Jacqueline J. Garner; Wade J. Brady, III; Frederick J. Telecky, Jr.

(57) ABSTRACT

Analog ICs frequently include circuits which operate over a wide current range. At low currents, low noise is important, while IC space efficiency is important at high currents. A vertically integrated transistor made of a JFET in parallel with an MOS transistor, sharing source and drain diffused regions, and with independent gate control, is disclosed. N-channel and p-channel versions may be integrated into common analog IC flows with no extra process steps, on either monolithic substrates or SOI wafers. pinchoff voltage in the JFET is controlled by photolithographically defined spacing of the gate well regions, and hence exhibits low variability.

19 Claims, 10 Drawing Sheets

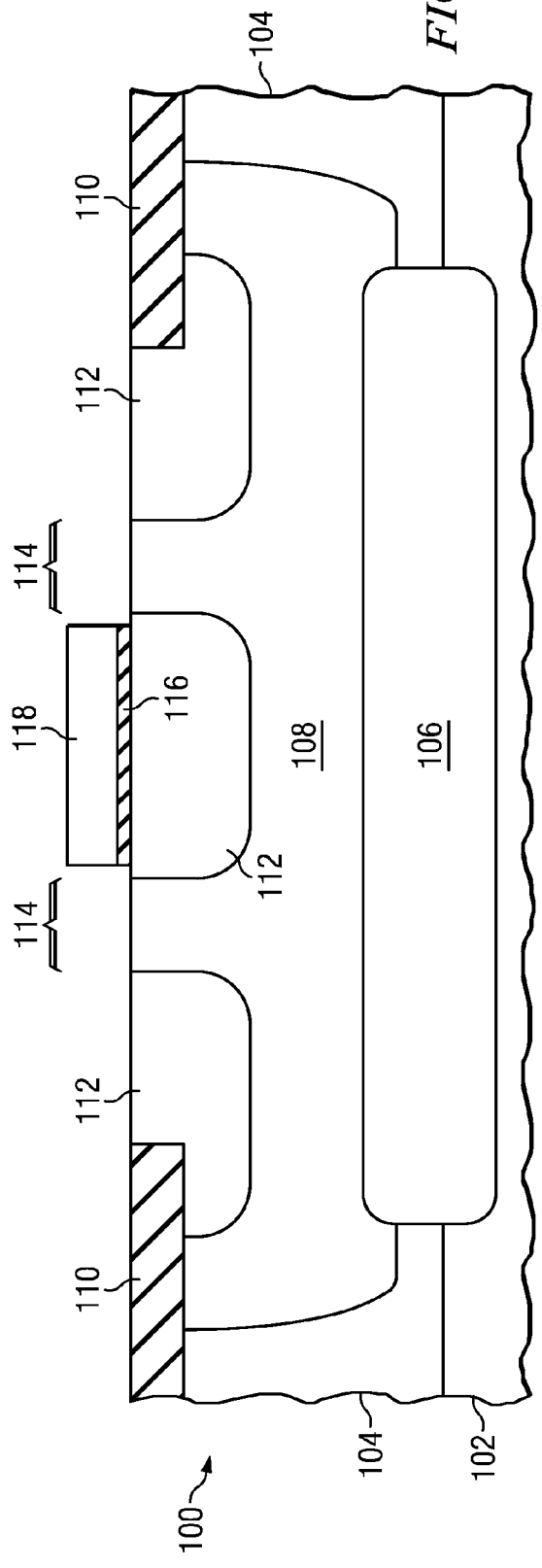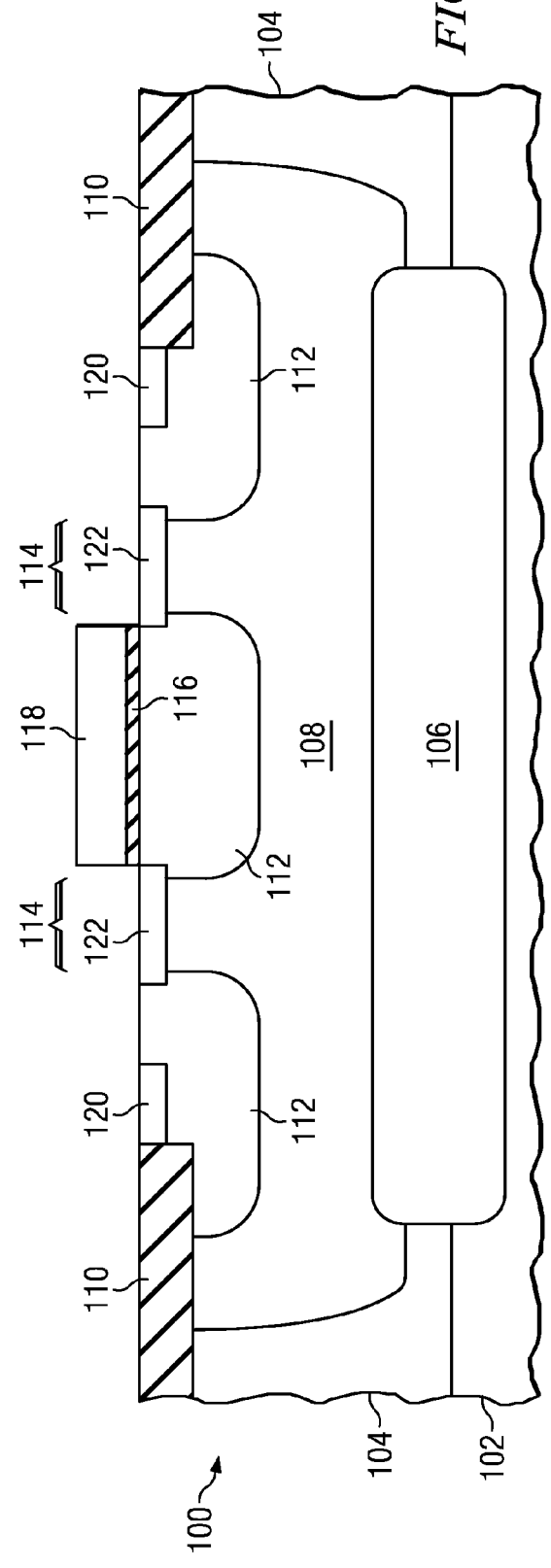

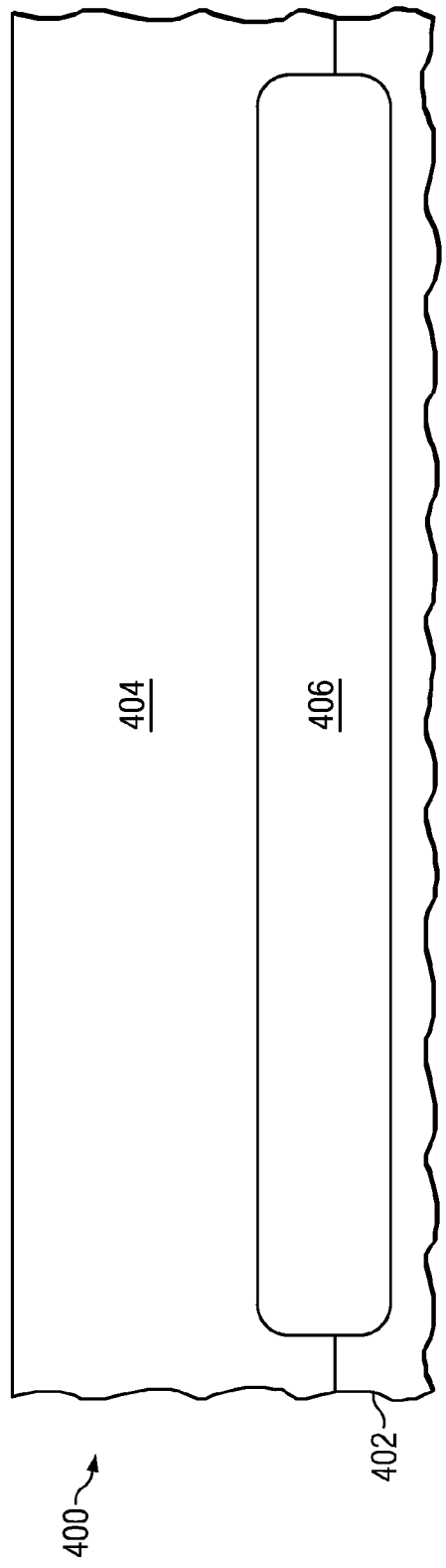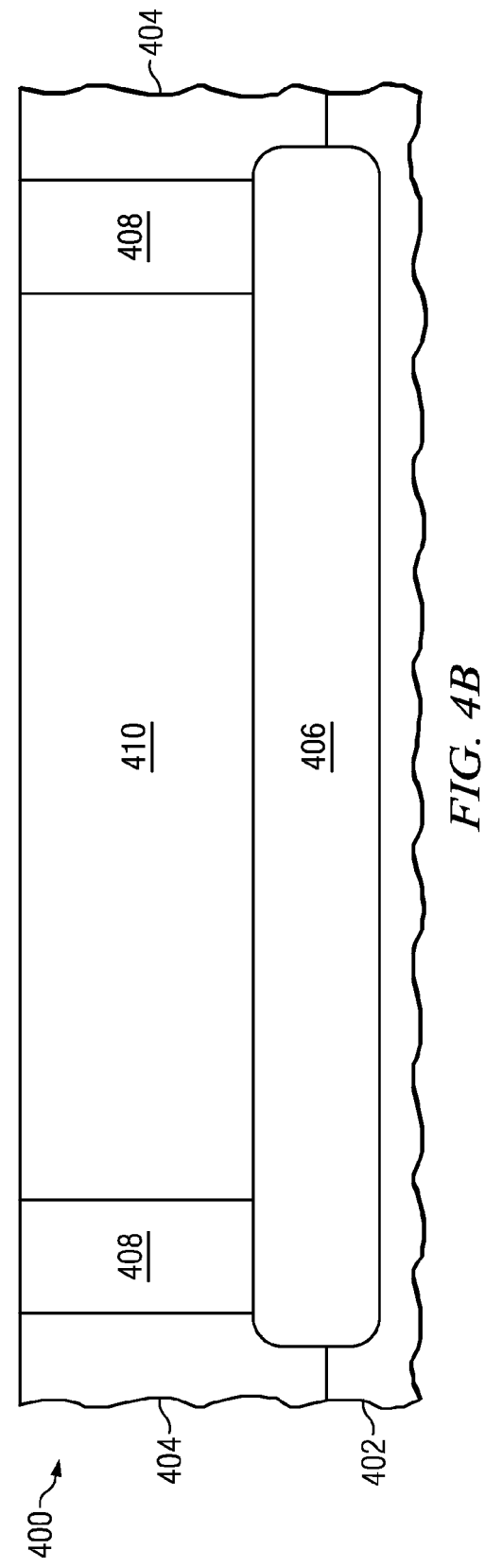

US 7,939,863 B2

AREA EFFICIENT 3D INTEGRATION OF LOW NOISE JFET AND MOS IN LINEAR BIPOLAR CMOS PROCESS

FIELD OF THE INVENTION

This invention relates to the field of integrated circuits. More particularly, this invention relates to integrated JFET and MOS transistors in integrated circuits.

BACKGROUND OF THE INVENTION

Junction field effect transistors (JFETs) in integrated circuits (ICs) provide low noise current switching and amplification, and are commonly used in analog circuits requiring high signal to noise ratios. Metal oxide semiconductor (MOS) transistors in ICs provide very high input impedance and high current density switching and amplification, and are commonly used in analog circuits to minimize IC area. Some analog circuits operate over a large current range, and require high signal to noise ratios at low currents while minimizing IC area. Integration of transistors with low noise operation and high current density capacity consumes significant IC area.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a vertically integrated transistor which includes a JFET and an MOS transistor sharing common source and drain nodes, with independently controlled gates, which may be integrated into common analog IC fabrication process sequences without adding process cost or complexity. Both n-channel and p-channel versions of the vertically integrated transistor may be integrated into common IC fabrication flows, on either monolithic substrates or silicon on insulator (SOI) wafers.

DESCRIPTION OF THE VIEWS OF THE DRAWING

FIG. 1A through FIG. 1G are cross-sections of an IC during successive stages of fabrication of an n-channel vertically integrated JFET and MOS transistor according to a first embodiment of the instant invention.

FIG. 4A through FIG. 4E depict a p-channel embodiment of the vertically integrated transistor formed in an IC.

DETAILED DESCRIPTION

Figure 1A:
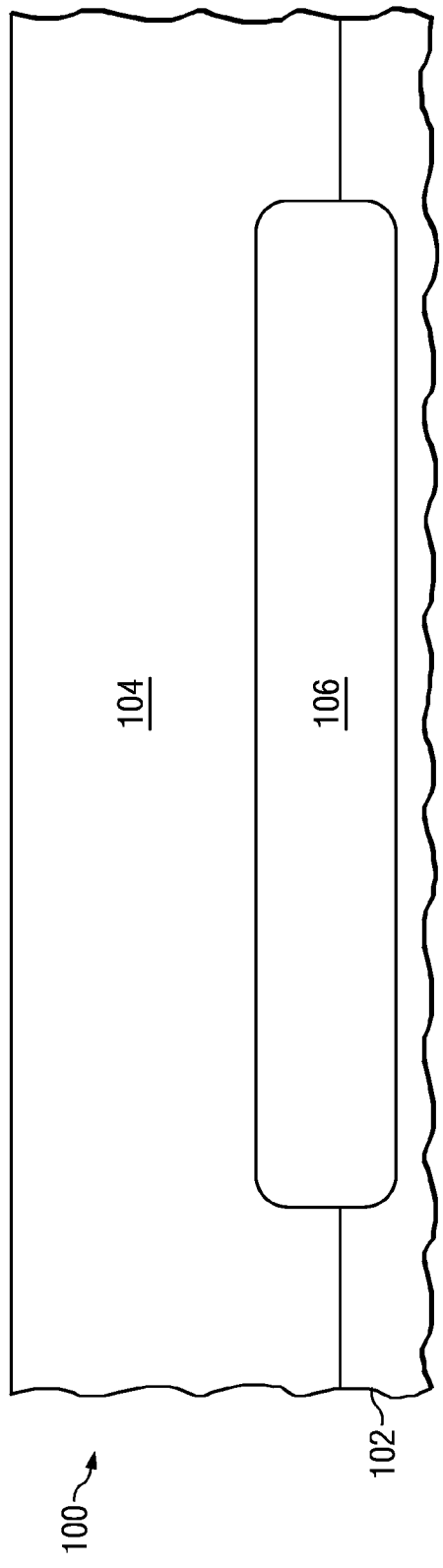

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The need for an integrated low noise and high current density capacity component in an IC is addressed by the instant invention, which provides a vertically integrated transistor including a junction field effect transistor (JFET) and a metal oxide semiconductor (MOS) transistor, compatible with common IC fabrication process sequences, and which offers independent gate control of the JFET and the MOS transistor. N-channel and p-channel versions of the inventive integrated transistor may be fabricated without adding fabrication cost or complexity.

FIG. 1A through FIG. 1G are cross-sections of an IC during successive stages of fabrication of an n-channel vertically integrated JFET and MOS transistor according to a first embodiment of the instant invention. Referring to FIG. 1A, the IC (100) is fabricated on a substrate (102), typically a silicon wafer including a top layer of p-type epitaxial silicon (104), commonly with an electrical resistivity between 1 and 100 ohm-cm. An n-type buried layer (106) with a sheet resistivity less than 100 ohms/square is formed by ion implantation of a first set of n-type dopants, preferably antimony, possibly including arsenic and/or phosphorus, at a dose of $1 \cdot 10^{14}$ to $1 \cdot 10^{16}$ atoms/cm², into a region of the substrate (102) defined for the inventive integrated transistor before formation of the epitaxial layer (104). Subsequent formation of the epitaxial layer (104) and an anneal process typically increase a thickness of the n-type buried layer (106) to 1 to 3 microns. A thickness of the p-type epitaxial layer (104) over the n-type buried layer (106) is typically 3 to 6 microns.

Figure 1B:
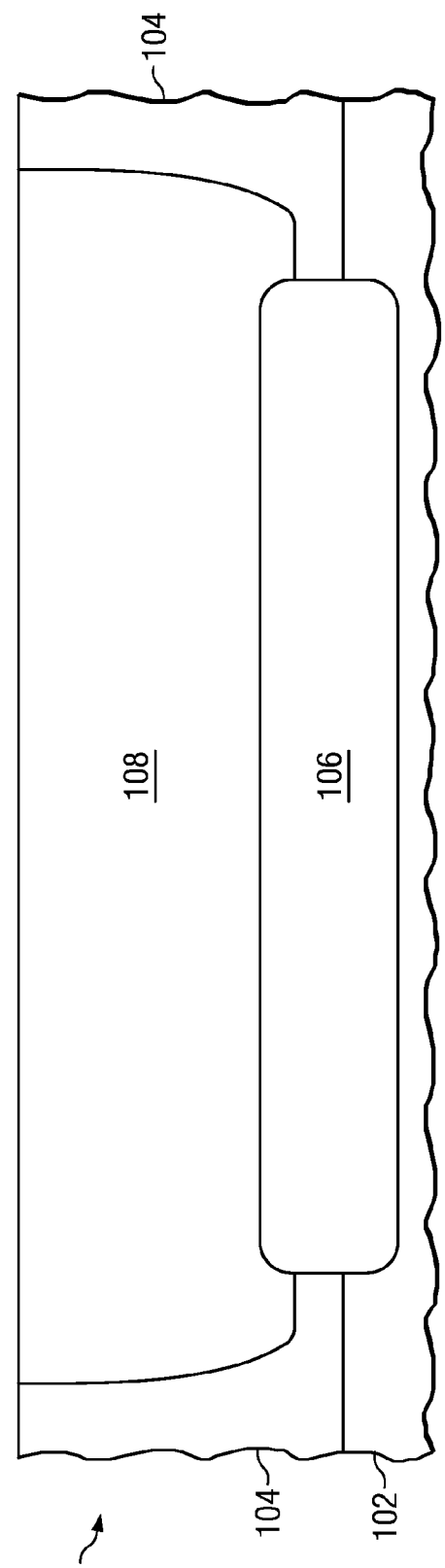

FIG. 1B shows the IC (100) after formation of a deep n-type well (108), commonly known as a deep n-well. The deep n-well (108) is formed by ion implantation of a second set of n-type dopants, typically phosphorus and arsenic, possibly including antimony, commonly in more than one step, at a total dose between $1 \cdot 10^{11}$ to $1 \cdot 10^{14}$ atoms/cm², into the p-type epitaxial layer (104) in the region defined for the inventive integrated transistor. The ion implantation of the second set of n-type dopants is followed by a deep n-well anneal process step in which the n-type dopants are diffused in the p-type epitaxial layer (104) in the region defined for the inventive integrated transistor and activated such that the deep n-well (108) extends from a top surface of the IC (100) to the n-type buried layer (106). Doses and energies of the ion implantation process of the second set of n-type dopants are selected, using known methods, to provide a desired distribution of n-type dopants in the deep n-well (108) after the deep n-well anneal process. For example, ion implanting phosphorus at $1 \cdot 10^{12}$ to $5 \cdot 10^{13}$ atoms/cm² with an energy of 1500 to 2500 keV and arsenic at $1 \cdot 10^{12}$ to $5 \cdot 10^{13}$ atoms/cm² with an energy of 100 to 200 keV, followed by a 2 to 4 hour anneal at 1100 to 1175 C, is sufficient to provide a deep n-well extending 3 to 5 microns deep.

Figure 1C:
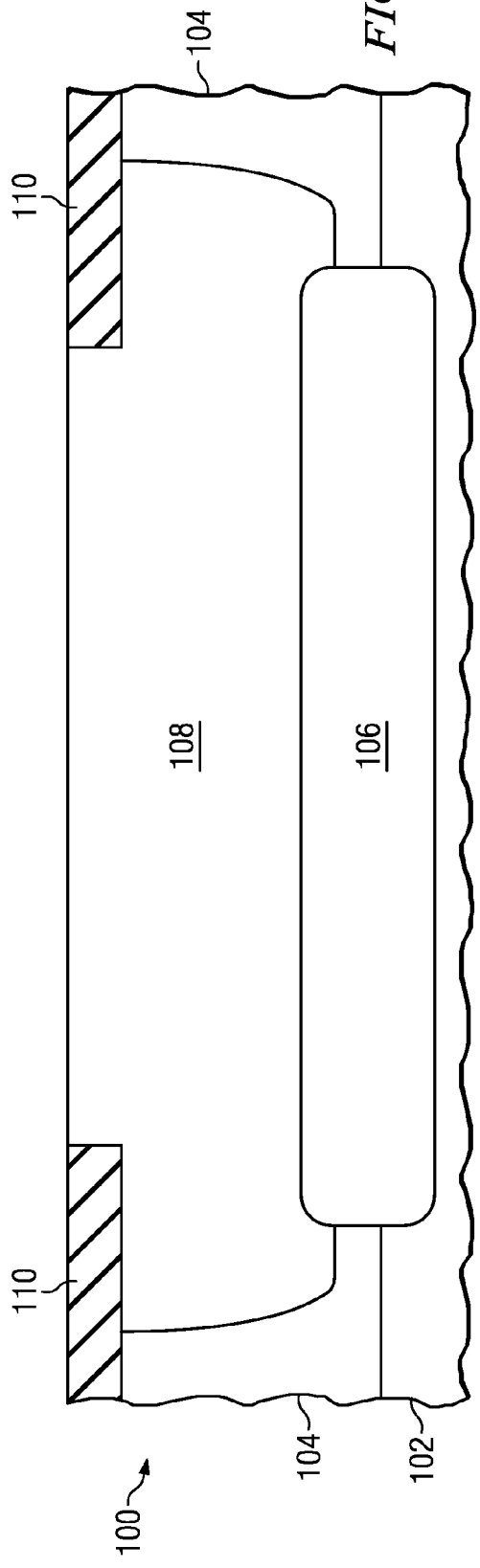

FIG. 1C shows the IC (100) after elements of field oxide (110) are formed at a top surface of the IC (100), overlapping edges of the deep n-well (108). The field oxide is typically silicon dioxide between 250 and 600 nanometers thick, commonly formed preferably by shallow trench isolation (STI) processes, or possibly by local oxidation of silicon (LOCOS) processes. In STI processes, trenches, commonly 250 to 500 nanometers deep, are etched into the IC (100), electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP).

Figure 1D:
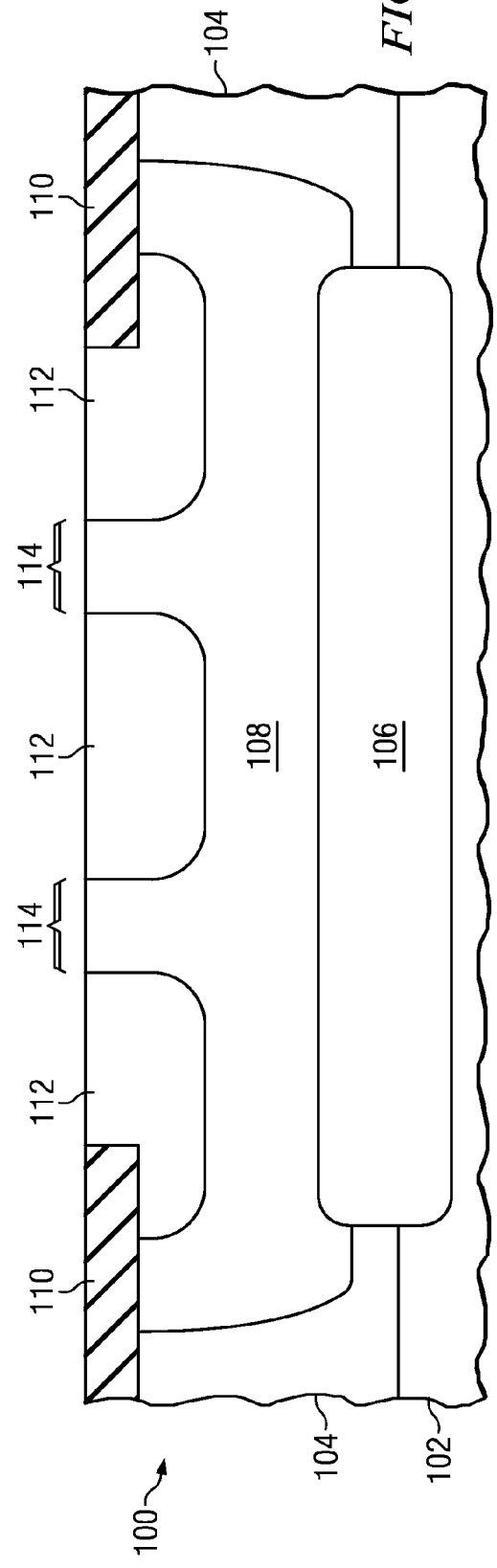

FIG. 1D shows the IC (100) after formation of regions of shallow p-type well (112), commonly known as shallow p-well or simply p-well. The p-well regions (112) are contiguous in regions out of the plane of FIG. 1D, and are configured such that two separate regions (114) inside a boundary of the deep n-well (108) are enclosed, separated by a region of p-well. The two separate enclosed regions (114) will form source and drain regions of a JFET in the inventive vertically integrated transistor. The p-well (112) is formed by ion implantation of a first set of p-type dopants, typically boron, possibly including gallium and/or indium, commonly in more than one step, at a total dose between $1 \cdot 10^{13}$ to $5 \cdot 10^{14}$ atoms/cm$^2$, into the deep n-well (108). The ion implantation of the first set of p-type dopants is followed by a p-well anneal process step in which the p-type dopants are diffused in the deep n-well (108) and activated such that the p-well regions (108) extend from a top surface of the deep n-well (108) to 50 to 2000 nanometers below a bottom surface of the field oxide (110). Doses and energies of the ion implantation process of the first set of p-type dopants are selected, using known methods, to provide a desired distribution of p-type dopants in the p-well (112) after the p-well anneal process. For example, ion implanting boron in four steps at $1 \cdot 10^{12}$ to $1 \cdot 10^{14}$ atoms/cm$^2$ with energies of 5 to 50 keV, 50 to 100 keV, 100 to 200 keV, and 200 to 500 keV, respectively, followed by a rapid thermal process (RTP) anneal at 1000 to 1100 C for 5 to 60 seconds, is sufficient to provide a p-well extending 300 to 700 nanometers deep.

FIG. 1E depicts the IC (100) at a further stage of fabrication. A gate dielectric layer (116), typically 1 to 5 nanometers of silicon dioxide, nitrogen doped silicon dioxide, silicon oxy-nitride, hafnium oxide, layers of silicon dioxide and silicon nitride, or other insulating material, is formed on a top surface of the p-well region (108) between the two separate enclosed regions (114). An MOS gate (118), typically polycrystalline silicon, commonly known as polysilicon, between 50 and 500 nanometers thick, is formed on a top surface of the gate dielectric layer, by deposition of a layer of gate material, formation of a gate photoresist pattern to define a gate region by known photolithographic methods, and removal of unwanted gate material by known etching methods.

FIG. 1F shows the IC (100) after formation of diffused contact regions in the vertically integrated transistor. P-type diffused contact regions (120) are formed at a top surface of the p-well regions (112) flanking the two separate enclosed regions (114), typically by ion implanting a second set of p-type dopants, commonly boron, often in the form BF$_2$, gallium and/or indium, at a total dose between $5 \cdot 10^{13}$ to $1 \cdot 10^{16}$ atoms/cm$^2$, at energies less than 50 keV, followed by an anneal to diffuse and activate the p-type dopants. It is common to form the p-type diffused contact regions (120) during process operations which form source and drain regions of p-channel MOS transistors in the IC (100). N-type source and drain regions (122) of the MOS transistor in the vertically integrated transistor are formed at the top surface of the deep n-well (108) adjacent to the MOS gate (116) and overlapping the p-well regions (112), typically by ion implantation of a third set of n-type dopants, commonly phosphorus and arsenic, and possibly antimony, at a total dose between $1 \cdot 10^{14}$ to $1 \cdot 10^{16}$ atoms/cm$^2$, at energies less than 100 keV, followed by an anneal to diffuse and activate the n-type dopants. It is common to perform one anneal operation to diffuse and activate the dopants in both the p-type diffused contact regions (120) and the n-type source and drain regions (122). It is within the scope of the instant invention to form the n-type source and drain regions (122) before the p-type diffused contact regions (120).

Figure 1G:
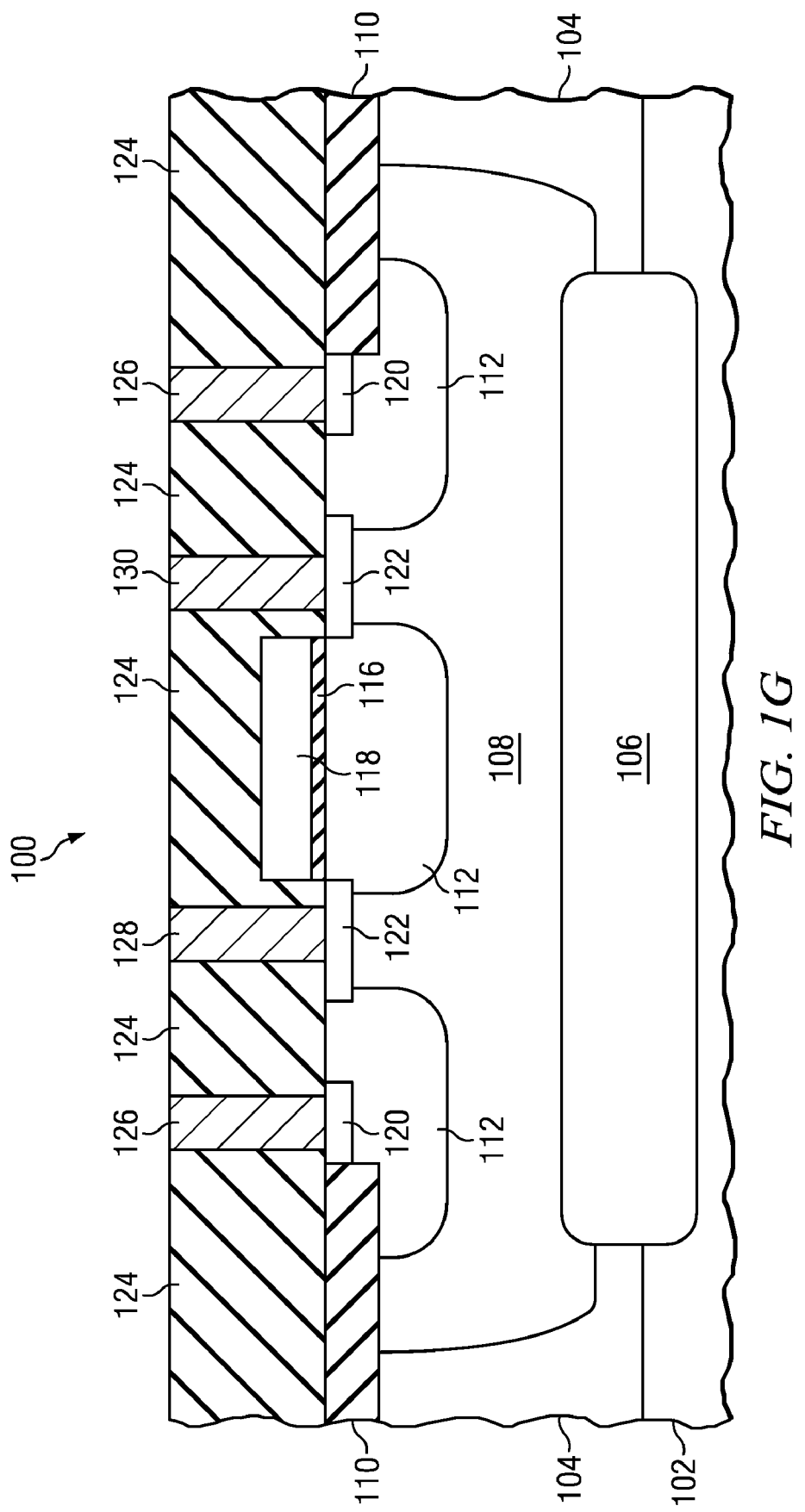

FIG. 1G depicts the IC (100) after a first set of interconnection elements are formed. A pre-metal dielectric layer (PMD) (124), typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the MOS gate (118), n-type source and drain regions (122), p-type diffused contact regions (120), p-well regions (112) and field oxide (110). P-well contacts (126), a drain contact (128) and a source contact (130) are formed in the PMD (124) to make electrical connections to the p-well (112), and source and drain of the inventive vertically integrated transistor, respectively. Contacts (126, 128, 130) are formed by forming a contact photoresist pattern on a top surface of the PMD (124) to expose regions for contacts, removing PMD material in the contact regions by known etching methods to expose the p-type contact diffused regions (120) and n-type source and drain regions (122), and filling the etched contact regions with metal, typically tungsten, to the top surface of the PMD (124). A contact to the MOS gate (118) is also formed, but not shown in FIG. 1G for clarity.

The inventive vertically integrated transistor includes the n-channel JFET formed by the n-type source and drain contact regions (122), the n-type channel regions in the deep n-well below the n-type source and drain contact regions (122) and the p-well gate (112), and the n-channel MOS transistor formed by the n-type source and drain contact regions (122), the gate dielectric later (116), the MOS gate (118) and the p-well substrate (112).

Figure 2:
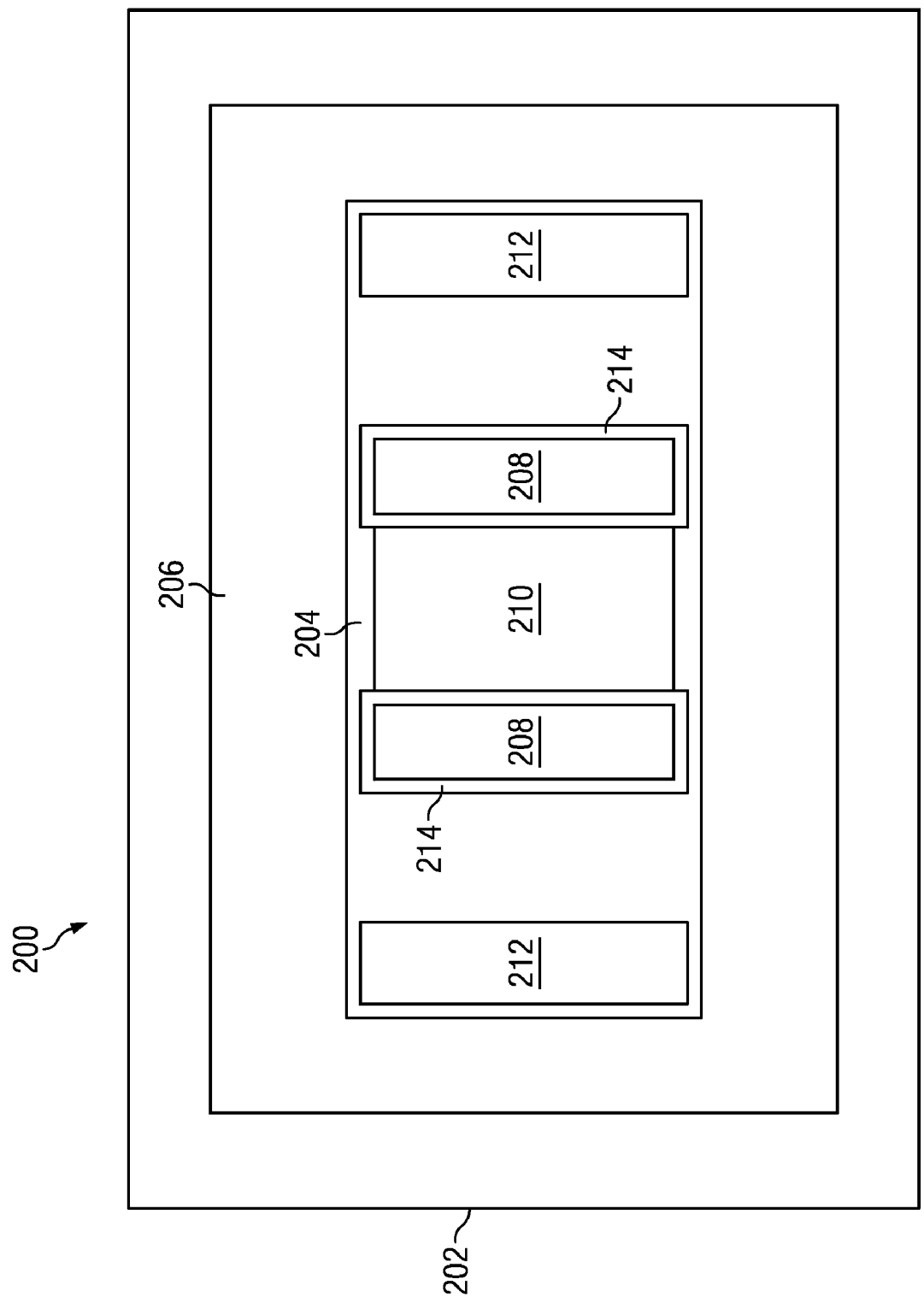
FIG. 2 is a top view of a vertically integrated transistor (200) formed according to the embodiment described in reference to FIG. 1A through FIG. 1G.

FIG. 2 is a top view of a vertically integrated transistor (200) formed according to the embodiment described in reference to FIG. 1A through FIG. 1G. A deep n-well (202) is formed in a p-type epitaxial layer. Field oxide is formed over the deep n-well (202) and surrounding p-type epitaxial layer, with an opening (204) inside a boundary of the deep n-well (202). A p-well (206) is formed in the deep n-well (202), such that two separate enclosed regions (208) are formed on lateral sides of a central p-well region. A gate dielectric layer and an MOS gate (210) are formed over the central p-well region between the two separate enclosed regions (208), and may overlap the field oxide to facilitate electrical contact formation. P-type diffused contact regions (212) are formed in the p-well (206) and n-type source and drain regions (214) are formed in the two separate enclosed regions (208) adjacent to the MOS gate (210). Electrical connect to the p-type diffused contact regions (212) may be used to bias the p-well gate of the JFET.

During operation of the vertically integrated transistor as embodied above, current from the drain to the source may flow through the JFET channel and be controlled by a JFET gate voltage applied to the p-well gate, and may flow through the MOS transistor channel and be controlled by an MOS gate voltage applied to the MOS gate. The JFET provides a lower noise current path while the MOS transistor provides a higher current density path. Pinchoff voltage of the JFET is controlled in part by the lateral spacing of the p-well regions, and hence is more reproducible than pinchoff voltage in other JFET configurations. Vertical integration of the JFET and MOS transistor is advantageous because it reduces area required for an IC in which it is included, and thereby reduces a cost of fabricating the IC.

Figure 3:
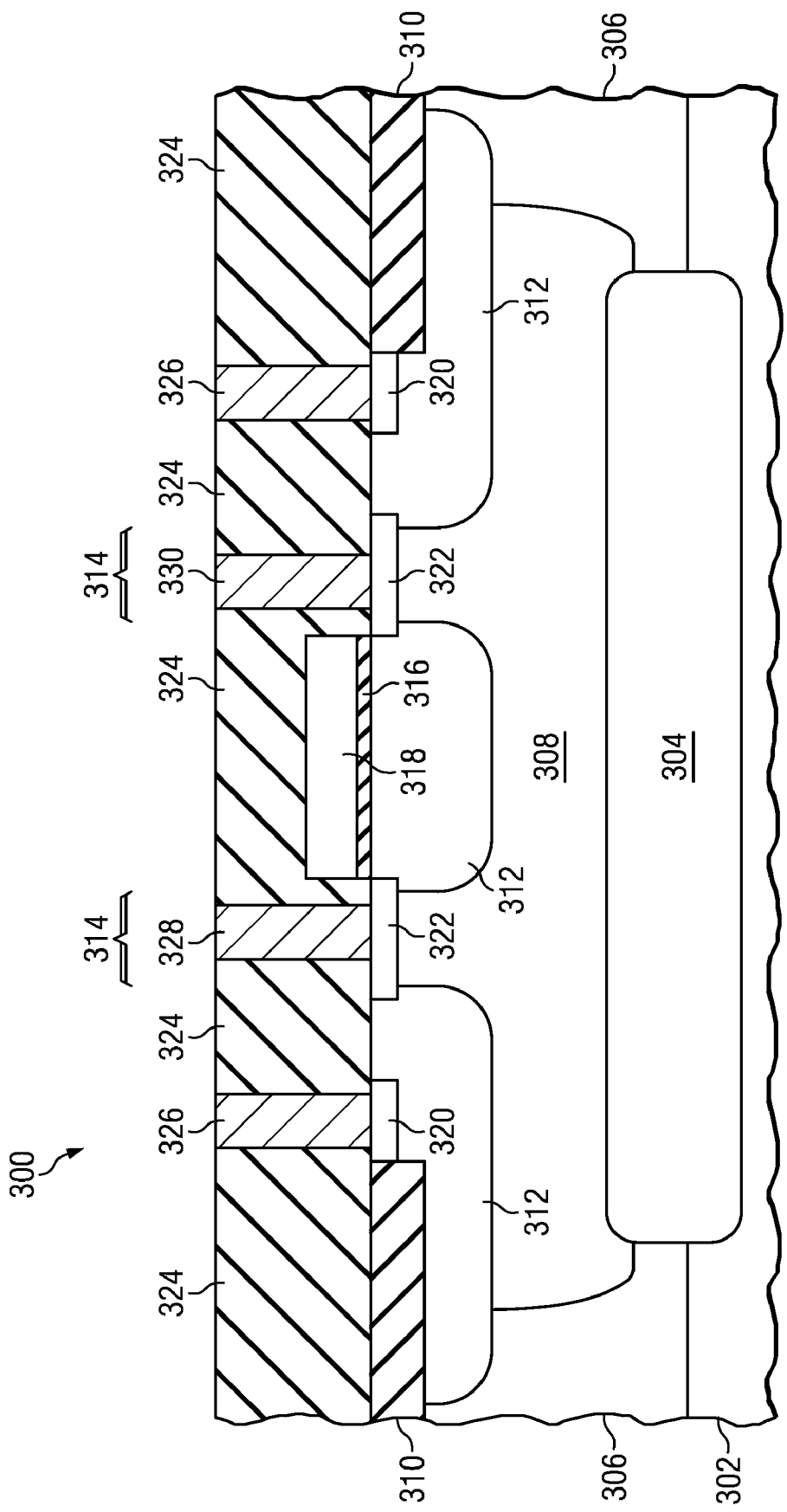
FIG. 3 depicts a cross-section of an alternate embodiment of the n-channel version of the inventive vertically integrated transistor formed in an IC (300).

FIG. 3 depicts a cross-section of an alternate embodiment of the n-channel version of the inventive vertically integrated transistor formed in an IC (300). Elements of the instant embodiment are formed similarly to corresponding elements described in reference to the embodiment depicted in FIG. 1A through FIG. 1G. A p-type substrate (302) has an n-type buried layer (304) formed at a top surface in a region defined for the vertically integrated transistor. A p-type epitaxial layer (306) is formed over the substrate (302) and n-type buried layer (304). A deep n-well (308) is formed in the p-type epitaxial layer (306) in the region defined for the vertically integrated transistor. Elements of field oxide (310) are formed at a top surface of the p-type epitaxial layer (306) overlapping an edge of the deep n-well (308). In the instant embodiment, the n-type region consisting of the deep n-well (308) and n-type buried layer (304) are completely enclosed by p-type material. P-well regions (312) are formed in the deep n-well (308) and overlapping the edge of the deep n-well (308), such that the p-well regions are contiguous in regions out of the plane of FIG. 3, and such that two separate enclosed regions (314) are formed, separated by a p-well region (312). A gate dielectric layer (316) is formed on a top surface of the central p-well region (312) between the two separate enclosed regions (314). An MOS gate (318) is formed on a top surface of the gate dielectric layer (316). P-type diffused contact regions (320) are formed in the p-well regions (312). N-type source and drain regions (322) are formed in the separate enclosed regions (314), adjacent to the MOS gate (318) and overlapping the p-well regions (312). A PMD layer (324) is formed on a top surface of the MOS gate (318), n-type source and drain regions (322), p-type diffused contact regions (320), p-well regions (312) and field oxide (110). P-well contacts (326), a source contact (328) and a drain contact (330) are formed in the PMD, making electrical contact with the p-well regions (312), source and drain of the vertically integrated transistor in the instant embodiment, respectively.

Enclosure of the deep n-well (308) and n-type buried layer (304) is advantageous because noise of source-drain current through the JFET in the inventive transistor is reduced.

Figure 4C:
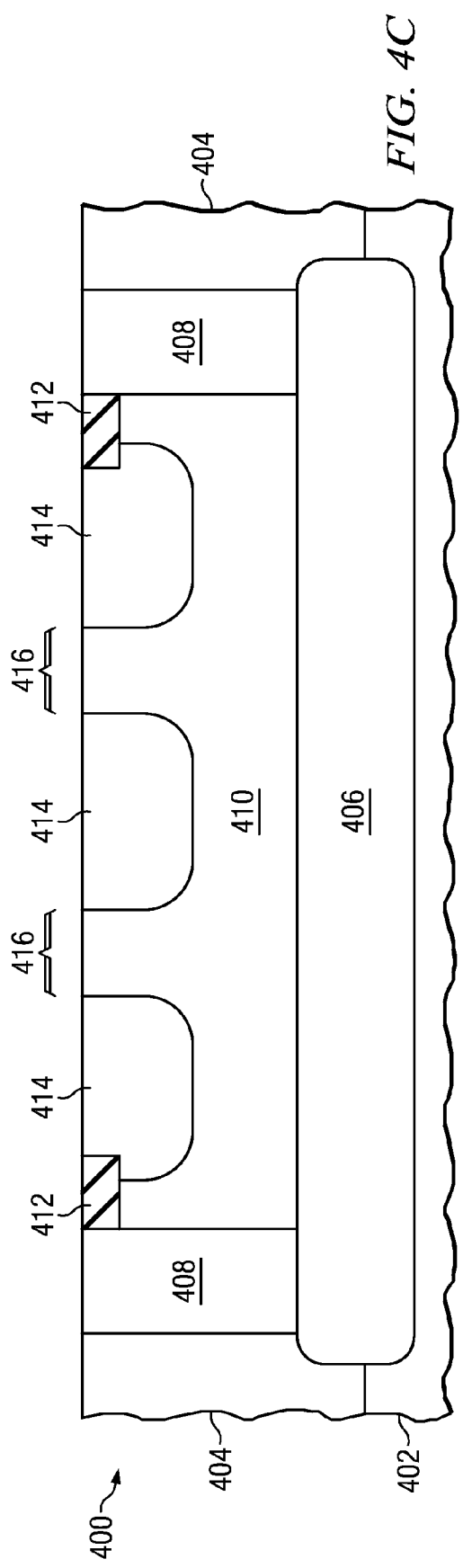

FIG. 4A through FIG. 4E depict a p-channel embodiment of the vertically integrated transistor formed in an IC. Referring to FIG. 4A, the IC (400) is fabricated on a substrate (402), typically a silicon wafer including a top layer of p-type epitaxial silicon (404), commonly with an electrical resistivity between 1 and 100 ohm-cm. An n-type buried layer (406) with a sheet resistivity less than 100 ohms/square is formed by ion implantation of a first set of n-type dopants, preferably antimony, possibly including arsenic and/or phosphorus, at a dose of $1 \cdot 10^{14}$ to $1 \cdot 10^{16}$ atoms/cm², into a region of the substrate (402) defined for the vertically integrated transistor before formation of the epitaxial layer (404). Subsequent formation of the epitaxial layer (404) and an anneal process typically increase a thickness of the n-type buried layer (406) to 1 to 3 microns. A thickness of the p-type epitaxial layer (404) over the n-type buried layer (406) is typically 3 to 6 microns.

FIG. 4B shows the IC (400) after formation of deep n-type regions (408), commonly known as n-sinkers, extending from a top surface of the p-type epitaxial layer (404) to the n-type buried layer (406) and surrounding the region defined for the vertically integrated transistor. N-sinkers (408) are common elements in ICs with analog components, and are typically formed by ion implanting a second set of n-type dopants, commonly phosphorus due to its high diffusivity compared to arsenic or antimony, at a dose between $1 \cdot 10^{15}$ and $5 \cdot 10^{16}$ atoms/cm², into a region of the p-type epitaxial layer (404) defined for the n-sinkers (408) by an n-sinker photoresist pattern formed on the top surface of the p-type epitaxial layer (404), followed by an anneal process, commonly more than 60 minutes at a temperature greater than 1000 C, to diffuse the second set of n-type dopants down to the n-type buried layer (406). After formation of the n-sinkers (408), the p-type epitaxial material in the region defined for the vertically integrated transistor (410) is electrically isolated from the p-type epitaxial material outside the region defined for the vertically integrated transistor (404) and from the substrate (402) by the combination of the n-sinkers (408) and the n-type buried layer (406).

FIG. 4C shows the IC (400) at a further stage of fabrication. Elements of field oxide (412) are formed at a top surface of the p-type epitaxial layer in the region defined for the vertically integrated transistor (410), adjacent to the n-sinkers (408). The field oxide is typically silicon dioxide between 250 and 600 nanometers thick, commonly formed preferably by shallow trench isolation (STI) processes, or possibly by local oxidation of silicon (LOCOS) processes. In STI processes, trenches, commonly 250 to 500 nanometers deep, are etched into the IC (100), electrically passivated, commonly by Still referring to FIG. 4C, regions of shallow n-type well (414), commonly known as shallow n-well or simply n-well, are formed in the p-type epitaxial layer in the region defined for the vertically integrated transistor (410). The n-well regions (414) are contiguous in regions out of the plane of FIG. 4C, and are configured such that two separate regions (416) inside the vertically integrated transistor p-type epitaxial layer region (410) are enclosed, separated by a region of n-well (414). The two separate enclosed regions (416) will form source and drain regions of a JFET in the inventive vertically integrated transistor. The n-well (414) is formed by ion implantation of a third set of n-type dopants, typically phosphorus, possibly including arsenic and antimony, commonly in more than one step, at a total dose between $1 \cdot 10^{13}$ to $5 \cdot 10^{14}$ atoms/cm², into the vertically integrated transistor p-type epitaxial layer region (410). The ion implantation of the third set of n-type dopants is followed by an n-well anneal process step in which the n-type dopants are diffused in the vertically integrated transistor p-type epitaxial layer region (410) and activated such that the n-well regions (414) extend from a top surface of the vertically integrated transistor p-type epitaxial layer region (410) to 50 to 300 nanometers below a bottom surface of the field oxide (412). Doses and energies of the ion implantation process of the third set of n-type dopants are selected, using known methods, to provide a desired distribution of n-type dopants in the n-well (414) after the n-well anneal process. For example, ion implanting phosphorus in four steps at $1 \cdot 10^{12}$ to $1 \cdot 10^{14}$ atoms/cm² with energies of 20 to 100 keV, 100 to 200 keV, 200 to 400 keV, and 400 to 800 keV, respectively, followed by a rapid thermal process (RTP) anneal at 1000 to 1100 C for 5 to 60 seconds, is sufficient to provide an n-well extending 300 to 700 nanometers deep.

Figure 4D:
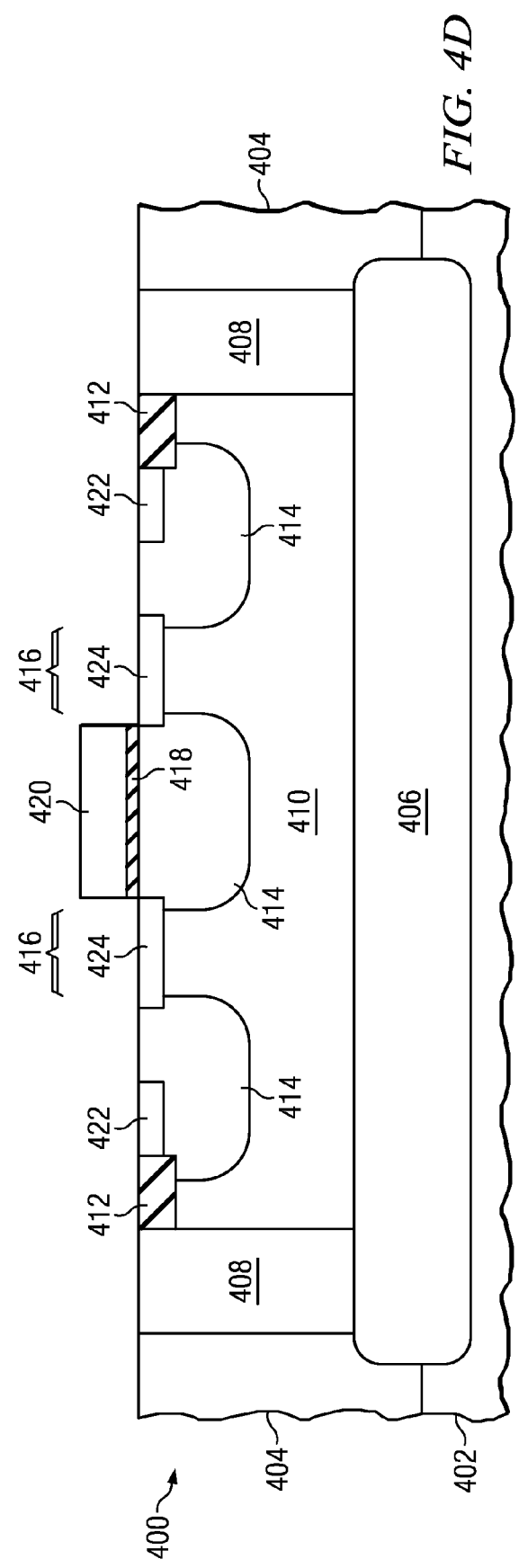

FIG. 4D depicts the IC (400) at yet a further stage of fabrication. A gate dielectric layer (418), typically 1 to 5 nanometers of silicon dioxide, nitrogen doped silicon dioxide, silicon oxy-nitride, hafnium oxide, layers of silicon dioxide and silicon nitride, or other insulating material, is formed on a top surface of the n-well region (414) between the two separate enclosed regions (416). An MOS gate (420), typically polycrystalline silicon, commonly known as polysilicon, between 50 and 500 nanometers thick, is formed on a top surface of the gate dielectric layer, by deposition of a layer of gate material, formation of a gate photoresist pattern to define a gate region by known photolithographic methods, and removal of unwanted gate material by known etching methods.

Still referring to FIG. 4D, diffused contact regions are formed in the vertically integrated transistor. N-type diffused contact regions (422) are formed at a top surface of the n-well regions (414) flanking the two separate enclosed regions (416), typically by ion implanting a fourth set of n-type dopants, commonly phosphorus and arsenic, and possibly antimony, at a total dose between $5 \cdot 10^{13}$ to $1 \cdot 10^{16}$ atoms/cm$^2$, at energies less than 100 keV, followed by an anneal to diffuse and activate the n-type dopants. It is common to form the n-type diffused contact regions (422) during process operations which form source and drain regions of n-channel MOS transistors in the IC (400). P-type source and drain regions (424) of the MOS transistor in the vertically integrated transistor are formed at the top surface of the vertically integrated transistor p-type epitaxial layer region (410) adjacent to the MOS gate (420) and overlapping the n-well regions (414), typically by ion implantation of a first set of p-type dopants, commonly boron, often in the form BF$_2$, and commonly including indium and/or gallium, at a total dose between $1 \cdot 10^{14}$ to $1 \cdot 10^{16}$ atoms/cm$^2$, at energies less than 50 keV, followed by an anneal to diffuse and activate the p-type dopants. It is common to perform one anneal operation to diffuse and activate the dopants in both the n-type diffused contact regions (422) and the p-type source and drain regions (424). It is within the scope of the instant invention to form the p-type source and drain regions (424) before the n-type diffused contact regions (422).

Figure 4E:
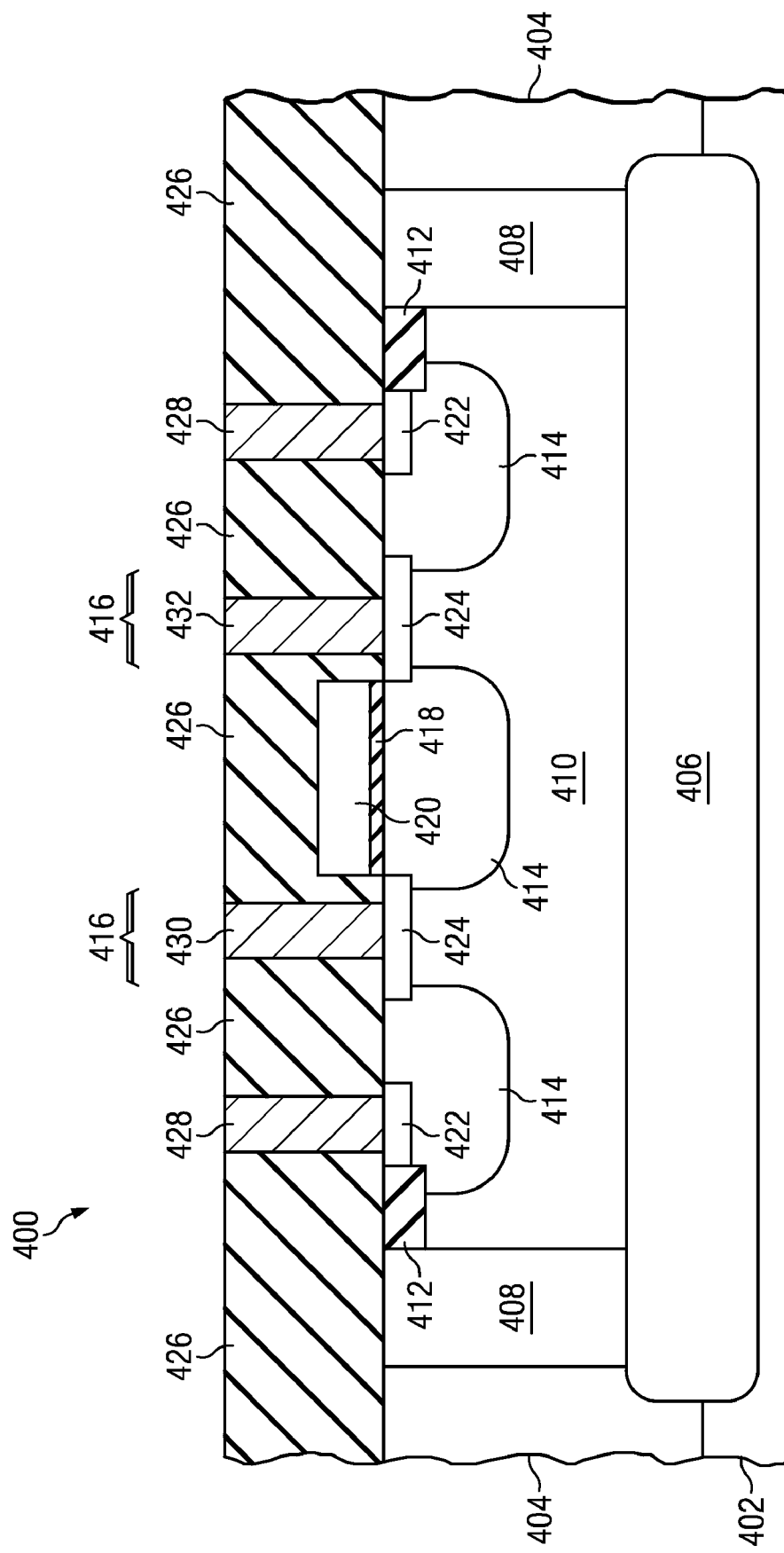

FIG. 4E depicts the IC (400) after a first set of interconnection elements are formed. A PMD (426), typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the MOS gate (420), p-type source and drain regions (424), n-type diffused contact regions (422), n-well regions (414) and field oxide (412). N-well contacts (428), a drain contact (430) and a source contact (432) are formed in the PMD (426) to make electrical connections to the n-well (414), and source and drain of the vertically integrated transistor, respectively. Contacts (428, 430, 432) are formed by forming a contact photoresist pattern on a top surface of the PMD (426) to expose regions for contacts, removing PMD material in the contact regions by known etching methods to expose the n-type contact diffused regions (422) and p-type source and drain regions (424), and filling the etched contact regions with metal, typically tungsten, to the top surface of the PMD (426). A contact to the MOS gate (420) is also formed, but not shown in FIG. 4E for clarity.

The inventive vertically integrated transistor includes the p-channel JFET formed by the p-type source and drain contact regions (424), the p-type channel regions in the vertically integrated transistor p-type epitaxial layer region (410) below the p-type source and drain contact regions (424) and the n-well gate (414), and the p-channel MOS transistor formed by the p-type source and drain contact regions (424), the gate dielectric later (418), the MOS gate (420) and the n-well substrate (414).

Figure 5:
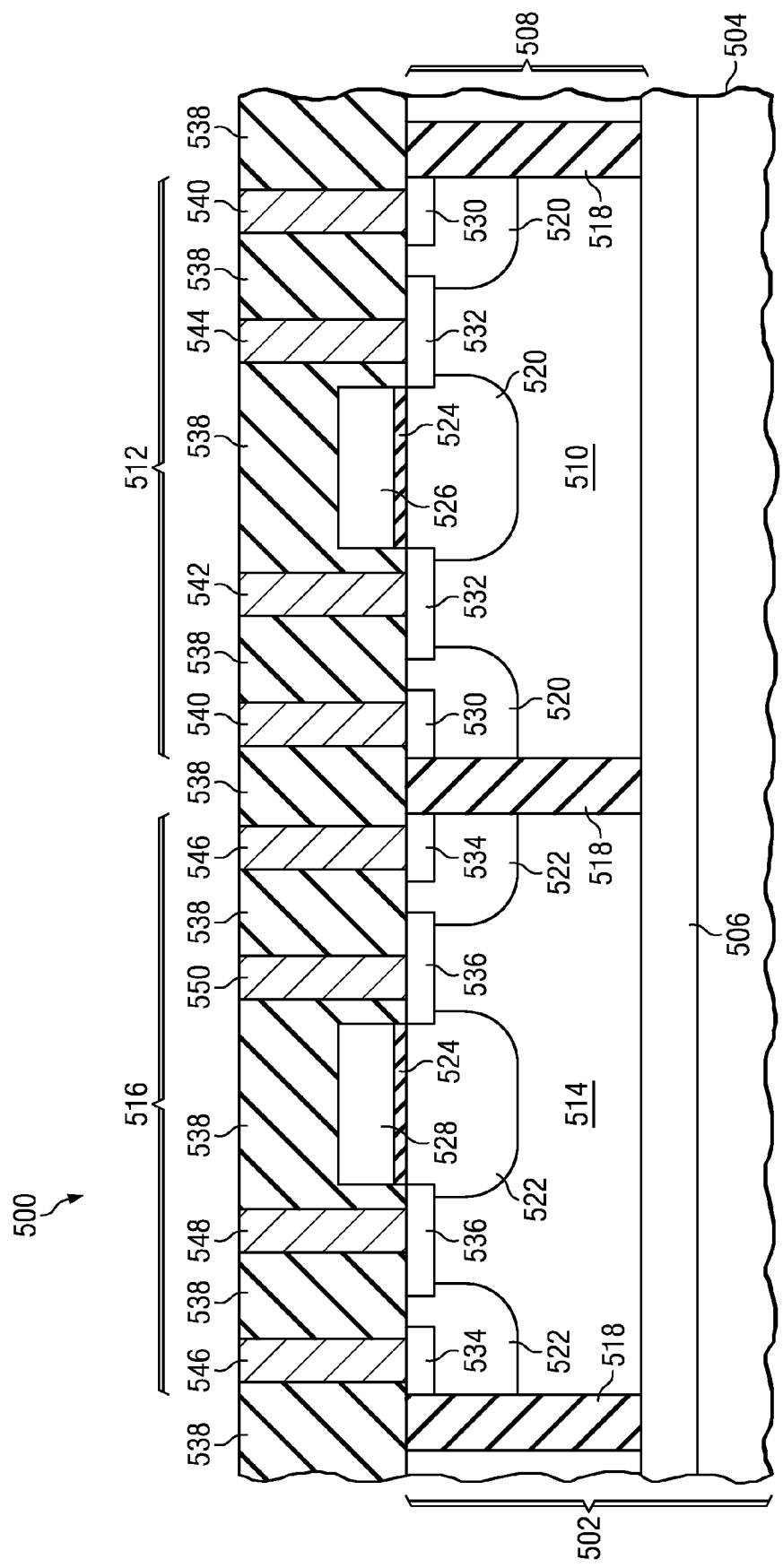
FIG. 5 depicts an n-channel vertically integrated transistor and a p-channel vertically integrated transistor formed in an IC (500) fabricated in a silicon-on-insulator (SOI) wafer (502) according to a further embodiment of the instant invention.

FIG. 5 depicts an n-channel vertically integrated transistor and a p-channel vertically integrated transistor formed in an IC (500) fabricated in a silicon-on-insulator (SOI) wafer (502) according to a further embodiment of the instant invention. The SOI wafer (502) includes a support wafer (504) which is commonly single crystal p-type silicon with an electrical resistivity above 50 ohm-cm, a buried oxide layer (506) which is typically silicon dioxide between 0.1 and 2 microns thick, formed on a top surface of the support wafer (504), and a single crystal silicon on insulator (SOI) film (508), typically silicon, commonly 50 nanometers to 10 microns thick, frequently p-type with an electrical resistivity between 1 and 100 ohm-cm, formed on a top surface of the buried oxide layer (506). It is common to grow single crystal silicon or silicon-germanium on a top surface of the single crystal SOI film (508) by epitaxial processes before fabricating components of the IC (500).

Still referring to FIG. 5, a deep n-well region (510) is formed in the SOI film (508) in a region defined for the n-channel vertically integrated transistor (512), typically by ion implanting a first set of n-type dopants, commonly phosphorus, and possibly arsenic and/or antimony, at a dose between $3 \cdot 10^{11}$ to $1 \cdot 10^{14}$ atoms/cm$^2$ with energies of 50 to 250 keV, followed by annealing the IC (500) to diffuse the n-type dopants from a top surface of the SOI film (508) to the buried oxide layer (506). Similarly, a deep p-well region (514) is formed in the SOI film (508) in a region defined for the p-channel vertically integrated transistor (516), typically by ion implanting a first set of p-type dopants, commonly boron, and possibly indium and/or gallium, at a dose between $3 \cdot 10^{11}$ to $1 \cdot 10^{14}$ atoms/cm$^2$ with energies of 20 to 150 keV, followed by annealing the IC (500) to diffuse the p-type dopants from the top surface of the SOI film (508) to the buried oxide layer (506). Elements of deep trench isolation (518) are formed in the SOI film (508) surrounding the region defined for the n-channel vertically integrated transistor (512) and the region defined for the p-channel vertically integrated transistor (516). Deep trench isolation is typically formed by etching deep trench regions in the SOI film (508) to expose the buried oxide layer (506), followed by filling the etched regions with silicon dioxide or other insulating material.

Continuing to refer to FIG. 5, regions of p-well (520) are formed in the region defined for the n-channel vertically integrated transistor (512), typically by ion implanting a second set of p-type dopants, including boron and possibly gallium and/or indium, at doses from $1 \cdot 10^{11}$ to $1 \quad 10^{14}$ atoms/cm$^2$, into the SOI film (508). A p-well photoresist pattern, not shown in FIG. 5 for clarity, is commonly used to block the second set of p-type dopants from the region defined for the p-channel vertically integrated transistor (516). The p-well (520) typically extends from a top surface of the SOI film (508) to a depth between 300 and 800 nanometers. The p-well regions (520) are contiguous in regions out of the plane of FIG. 5, and are configured such that two separate n-type regions inside the region defined for the n-channel vertically integrated transistor (512) are enclosed, separated by a region of p-well. The two separate enclosed n-type regions will form source and drain regions of an n-channel JFET in the n-channel vertically integrated transistor. The ion implantation process to form the p-well (520) is commonly used to form p-wells for n-channel MOS (NMOS) transistors, and may include additional steps to implant additional p-type dopants at shallower depths for purposes of improving NMOS transistor performance, such as threshold adjustment, leakage current reduction and suppression of parasitic bipolar operation. A sheet resistivity of the p-well (520) is commonly between 100 and 1000 ohms/square. Similarly, regions of n-well (522) are formed in the region defined for the p-channel vertically integrated transistor (516), typically by ion implanting a second set of n-type dopants, including phosphorus and arsenic, and possibly antimony, at doses from $1 \cdot 10^{11}$ to $1 \cdot 10^{14}$ atoms/cm$^2$, into the SOI film (508). An n-well photoresist pattern, not shown in FIG. 5 for clarity, is commonly used to block the second set of n-type dopants from the region defined for the n-channel vertically integrated transistor (512). The n-well (522) typically extends from a top surface of the SOI film (508) to a depth between 300 and 800 nanometers. The n-well regions (522) are contiguous in regions out of the plane of FIG. 5, and are configured such that two separate p-type regions inside the region defined for the p-channel vertically integrated transistor (516) are enclosed, separated by a region of n-well. The two separate enclosed p-type regions will form source and drain regions of a p-channel JFET in the p-channel vertically integrated transistor. The ion implantation process to form the n-well (522) is commonly used to form n-wells for p-channel MOS (PMOS) transistors, and may include additional steps to implant additional n-type dopants at shallower depths for purposes of improving PMOS transistor performance, such as threshold adjustment, leakage current reduction and suppression of parasitic bipolar operation. A sheet resistivity of the n-well (522) is commonly between 100 and 1000 ohms/square.

Still referring to FIG. 5, a gate dielectric layer (524), typically 1 to 5 nanometers of silicon dioxide, nitrogen doped silicon dioxide, silicon oxy-nitride, hafnium oxide, layers of silicon dioxide and silicon nitride, or other insulating material, is formed on a top surface of the n-channel vertically integrated transistor region (512) between the two separate enclosed n-type regions, and on a top surface of the p-channel vertically integrated transistor region (516) between the two separate enclosed p-type regions. An n-channel MOS gate (526) and a p-channel MOS gate (528), typically polycrystalline silicon, commonly known as polysilicon, between 50 and 500 nanometers thick, are formed on a top surface of the gate dielectric layer, by deposition of a layer of gate material, formation of a gate photoresist pattern to define n-channel and p-channel gate regions by known photolithographic methods, and removal of unwanted gate material by known etching methods.

Continuing to refer to FIG. 5, p-type diffused contact regions (530) are formed at a top surface of the p-well regions (520) flanking the two separate enclosed n-type regions, typically by ion implanting a third set of p-type dopants, commonly boron, often in the form BF$_2$, gallium and/or indium, at a total dose between $5 \cdot 10^{13}$ to $1 \cdot 10^{16}$ atoms/cm$^2$, at energies less than 50 keV, followed by an anneal to diffuse and activate the p-type dopants. It is common to form the p-type diffused contact regions (530) during process operations which form source and drain regions of PMOS transistors in the IC (500). N-type source and drain regions (532) of the NMOS transistor in the n-channel vertically integrated transistor are formed at the top surface of the deep n-well (510) adjacent to the n-channel MOS gate (526) and overlapping the p-well regions (520), typically by ion implantation of a third set of n-type dopants, commonly phosphorus and arsenic, and possibly antimony, at a total dose between $1 \cdot 10^{14}$ to $1 \cdot 10^{16}$ atoms/cm$^2$, at energies less than 100 keV, followed by an anneal to diffuse and activate the n-type dopants.

Similarly, n-type diffused contact regions (534) are formed at a top surface of the n-well regions (522) flanking the two separate enclosed p-type regions, typically by ion implanting a third set of n-type dopants, phosphorus and arsenic, and possibly antimony, at a total dose between $5 \cdot 10^{13}$ to $1 \cdot 10^{16}$ atoms/cm$^2$, at energies less than 100 keV, followed by an anneal to diffuse and activate the n-type dopants. It is common to form the n-type diffused contact regions (534) during process operations which form source and drain regions of NMOS transistors in the IC (500). P-type source and drain regions (536) of the PMOS transistor in the p-channel vertically integrated transistor are formed at the top surface of the deep p-well (514) adjacent to the p-channel MOS gate (528) and overlapping the n-well regions (522), typically by ion implantation of a third set of p-type dopants, commonly boron, often in the form BF$_2$, gallium and/or indium, at a total dose between $1 \cdot 10^{14}$ to $1 \cdot 10^{16}$ atoms/cm$^2$, at energies less than 50 keV, followed by an anneal to diffuse and activate the p-type dopants. It is common to perform one anneal operation to diffuse and activate the dopants in both the n-type diffused contact regions (534), the p-type source and drain regions (536), the p-type diffused contact regions (530) and the n-type source and drain regions (532). It is within the scope of the instant invention to form the p-type source and drain regions (536), the n-type diffused contact regions (534), the n-type source and drain regions (532) and the p-type diffused contact regions (530) in any order. Furthermore, it is common to form the n-type diffused contact regions (534) and the n-type source and drain regions (532) in the same process operations. Similarly, it is common to form the p-type source and drain regions (536) and the p-type diffused contact regions (530) in the same process operations.

Continuing to refer to FIG. 5, a PMD (538), typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on the n-channel MOS gate (526), the p-channel MOS gate (528), n-type source and drain regions (532), p-type source and drain regions (536), p-type diffused contact regions (530), n-type diffused contact regions (534), p-well regions (520), n-well regions (522) and deep trench isolation elements (518). P-well contacts (540), an n-channel drain contact (542) and an n-channel source contact (544) are formed in the PMD (538) to make electrical connections to the p-well (520), and source and drain of the n-channel vertically integrated transistor, respectively. Similarly, n-well contacts (546), a p-channel drain contact (548) and a p-channel source contact (550) are formed in the PMD (538) to make electrical connections to the n-well (522), and source and drain of the p-channel vertically integrated transistor, respectively. Contacts (540, 542, 544, 546, 548, 550) are formed by forming a contact photoresist pattern on a top surface of the PMD (538) to expose regions for contacts, removing PMD material in the contact regions by known etching methods to expose the p-type contact diffused regions (530), n-type source and drain regions (532), n-type contact diffused regions (534) and n-type source and drain regions (536), and filling the etched contact regions with metal, typically tungsten, to the top surface of the PMD (538). Contacts to the n-channel MOS gate (526) and p-channel MOS gate (528) are also formed, but not shown in FIG. 5 for clarity.

The n-channel vertically integrated transistor includes the n-channel JFET formed by the n-type source and drain contact regions (532), the n-type channel regions in the deep n-well (510) below the n-type source and drain contact regions (532) and the p-well gate (520), and the n-channel MOS transistor formed by the n-type source and drain contact regions (532), the gate dielectric later (524), the n-channel MOS gate (526) and the p-well substrate (520). The p-channel vertically integrated transistor includes the p-channel JFET formed by the p-type source and drain contact regions (536), the p-type channel regions in the deep p-well (514) below the p-type source and drain contact regions (536) and the n-well gate (522), and the p-channel MOS transistor formed by the p-type source and drain contact regions (536), the gate dielectric later (524), the p-channel MOS gate (528) and the n-well substrate (522).

Any of the embodiments discussed above may be enhanced by forming a cascode vertically integrated transistor which includes two or more vertically integrated transistors in a single well, connected so that an output of a first vertically integrated transistor feeds an input of a second vertically integrated transistor, and so on. A cascode configuration is advantageous because drive current in a last JFET is desirably flatter as a function of gate voltage in a first JFET.

What is claimed is:

1. A vertically integrated junction field effect transistor (JFET) and metal oxide semiconductor (MOS) transistor, comprising:
    a semiconductor substrate;
    an isolated region of a first electrically conductive type formed in said semiconductor substrate;
    a well of a second electrically conductive type formed in said isolated region, whereby two separate enclosed regions of said isolated region are enclosed by said well;
    a gate dielectric layer formed on a top surface of said well between said two separate enclosed regions;
    an MOS gate formed on a top surface of said gate dielectric layer;
    source and drain regions of said first electrically conductive type formed in said two separate enclosed regions adjacent to said MOS gate; and
    contacts to said well, said MOS gate and said source and drain regions.

2. The vertically integrated JFET and MOS transistor of claim 1, in which:
    said semiconductor substrate further comprises a top layer of p-type epitaxial semiconductor;
    said isolated region is a deep n-well formed in said layer of p-type epitaxial semiconductor;
    said well is a p-well; and
    said source and drain regions are n-type.

3. The vertically integrated JFET and MOS transistor of claim 2, in which said p-well is contained within a boundary of said deep n-well.

4. The vertically integrated JFET and MOS transistor of claim 2, in which said p-well overlaps a boundary of said deep n-well.

5. The vertically integrated JFET and MOS transistor of claim 1, in which:
    said semiconductor substrate further comprises a top layer of p-type epitaxial semiconductor;
    said isolated region is isolated by an n-type buried layer and n-sinkers;
    said well is an n-well; and
    said source and drain regions are p-type.

6. The vertically integrated JFET and MOS transistor of claim 1, in which:
    said semiconductor substrate is a silicon on insulator (SOI) film on an SOI wafer;
    said isolated region is an n-type region of said SOI film which is isolated by a buried oxide layer and elements of deep trench isolation in said SOI film;
    said well is a p-well; and
    said source and drain regions are n-type.

7. The vertically integrated JFET and MOS transistor of claim 1, in which:
    said semiconductor substrate is a silicon on insulator (SOI) film on an SOI wafer;
    said isolated region is a p-type region of said SOI film which is isolated by a buried oxide layer and elements of deep trench isolation in said SOI film;
    said well is an n-well; and
    said source and drain regions are p-type.

8. An integrated circuit comprising:
    a semiconductor substrate;
    an isolated region of a first electrically conductive type formed in said semiconductor substrate;
    a well of a second electrically conductive type formed in said isolated region, whereby two separate enclosed regions of said isolated region are enclosed by said well;
    a gate dielectric layer formed on a top surface of said well between said two separate enclosed regions;
    an MOS gate formed on a top surface of said gate dielectric layer;
    source and drain regions of said first electrically conductive type formed in said two separate enclosed regions adjacent to said MOS gate; and
    contacts to said well, said MOS gate and said source and drain regions.

9. The integrated circuit of claim 8, in which:
    said semiconductor substrate further comprises a top layer of p-type epitaxial semiconductor;
    said isolated region is a deep n-well formed in said layer of p-type epitaxial semiconductor;
    said well is a p-well; and
    said source and drain regions are n-type.

10. The integrated circuit of claim 8, in which:
    said semiconductor substrate further comprises a top layer of p-type epitaxial semiconductor;
    said isolated region is isolated by an n-type buried layer and n-sinkers;
    said well is an n-well; and
    said source and drain regions are p-type.

11. The integrated circuit of claim 8, in which:
    said semiconductor substrate is a silicon on insulator (SOI) film on an SOI wafer;
    said isolated region is an n-type region of said SOI film which is isolated by a buried oxide layer and elements of deep trench isolation in said SOI film;
    said well is a p-well; and
    said source and drain regions are n-type.

12. The integrated circuit of claim 8, in which:
    said semiconductor substrate is a silicon on insulator (SOI) film on an SOI wafer;

said isolated region is a p-type region of said SOI film which is isolated by a buried oxide layer and elements of deep trench isolation in said SOI film;
said well is an n-well; and
said source and drain regions are p-type.

13. The integrated circuit of claim 12, further comprising:
a second isolated region formed in said semiconductor substrate distinct and separate from said first isolated region, further comprising an n-type region of said SOI film which is isolated by said buried oxide layer and a second set of elements of deep trench isolation in said SOI film;
a p-well formed in said second isolated region, whereby two separate enclosed n-type regions of said second isolated region are enclosed by said p-well;
a second gate dielectric layer formed on a top surface of said p-well between said two separate enclosed n-type regions;
a second MOS gate formed on a top surface of said second gate dielectric layer;
n-type source and drain regions formed in said two separate enclosed n-type regions adjacent to said second MOS gate; and
contacts to said p-well, said second MOS gate and said n-type source and drain regions.

14. A method of forming an integrated circuit, comprising the steps of;
providing a semiconductor substrate;
forming an isolated region of a first electrically conductive type in said semiconductor substrate;
forming a well of a second electrically conductive type in said isolated region, whereby two separate enclosed regions of said isolated region are enclosed by said well;
forming a gate dielectric layer on a top surface of said well between said two separate enclosed regions;
forming an MOS gate on a top surface of said gate dielectric layer;
forming source and drain regions of said first electrically conductive type in said two separate enclosed regions adjacent to said MOS gate; and
forming contacts to said well, said MOS gate and said source and drain regions.

15. The method of claim 14, in which:
said semiconductor substrate comprises a top layer of p-type epitaxial semiconductor;
said step of forming and isolated region further comprises forming a deep n-well in said layer of p-type epitaxial semiconductor;
said well is a p-well; and
said source and drain regions are n-type.

16. The method of claim 14, in which:
said semiconductor substrate further comprises a top layer of p-type epitaxial semiconductor;
said step of forming an isolated region further comprises forming an n-type buried layer and n-sinkers surrounding said isolated region;
said well is an n-well; and
said source and drain regions are p-type.

17. The method of claim 14, in which:
said semiconductor substrate is a silicon on insulator (SOI) film on an SOI wafer;
said step of forming an isolated region further comprises the steps of:
  forming an n-type region of said SOI film; and
  forming deep trench isolation in said SOI film connecting to a buried oxide layer and surrounding said n-type region;
said well is a p-well; and
said source and drain regions are n-type.

18. The method of claim 14, in which:
said semiconductor substrate is a silicon on insulator (SOI) film on an SOI wafer;
said step of forming an isolated region further comprises the steps of:
  forming a p-type region of said SOI film; and
  forming deep trench isolation in said SOI film connecting to a buried oxide layer and surrounding said p-type region;
said well is an n-well; and
said source and drain regions are p-type.

19. The method of claim 18, further comprising the steps of:
forming a second isolated region in said semiconductor substrate distinct and separate from said first isolated region, by a process further comprising the steps of:
  forming an n-type region of said SOI film; and
  forming a second set of elements of deep trench isolation in said SOI film connecting to said buried oxide layer and surrounding said n-type region;
forming a p-well in said second isolated region, whereby two separate enclosed n-type regions of said second isolated region are enclosed by said p-well;
forming a second gate dielectric layer on a top surface of said p-well between said two separate enclosed n-type regions;
forming a second MOS gate on a top surface of said second gate dielectric layer;
forming n-type source and drain regions in said two separate enclosed n-type regions adjacent to said second MOS gate; and
forming contacts to said p-well, said second MOS gate and said n-type source and drain regions.

* * * * *